United States Patent
Qi

(10) Patent No.: US 10,411,061 B2
(45) Date of Patent: Sep. 10, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: De Kui Qi, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/924,061

(22) Filed: Mar. 16, 2018

(65) Prior Publication Data

US 2018/0269252 A1  Sep. 20, 2018

(30) Foreign Application Priority Data

Mar. 17, 2017  (CN) .......................... 2017 1 0163795

(51) Int. Cl.
*H01L 21/266* (2006.01)
*H01L 27/146* (2006.01)

(52) U.S. Cl.
CPC ...... *H01L 27/14689* (2013.01); *H01L 21/266* (2013.01); *H01L 27/14612* (2013.01); *H01L 27/14636* (2013.01)

(58) Field of Classification Search
CPC ............. H01L 27/14689; H01L 21/266; H01L 27/14612; H01L 27/14636; H01L 27/1461; H01L 27/3269; H01L 27/14609; H01L 27/3246; H01L 27/14643; H01L 21/2815; H01L 21/823468; H01L 21/823864; H01L 29/66689

See application file for complete search history.

(56) References Cited

U.S. PATENT DOCUMENTS 9,570,494 B1 * 2/2017 Jerome ............... H01L 27/1463
2008/0179640 A1 * 7/2008 Chuang ............ H01L 27/14689
257/292

(Continued)

*Primary Examiner* — Shahed Ahmed
(74) *Attorney, Agent, or Firm* — Anova Law Group, PLLC

(57) ABSTRACT

A semiconductor structure and a fabrication method are provided. The fabrication method includes: providing a substrate, containing first doping ions and including a pixel region for forming a pixel structure; forming a deeply doped region, in the photosensitive region of the substrate and containing second doping ions; forming a floating diffusion area in the floating diffusion region of the substrate and containing third doping ions; forming a gate structure on the substrate at the junction of the photosensitive region and the floating diffusion region; forming a sidewall film covering the gate structure and the substrate; forming a sidewall spacer; forming a first doped region in the floating diffusion region on one side of the gate structure; forming a metal connection layer on the first doped region; forming an interlayer dielectric layer on the substrate; and forming a source/drain contact plug in the interlayer dielectric layer.

13 Claims, 7 Drawing Sheets

(56) References Cited

U.S. PATENT DOCUMENTS

| | | | | |
|---|---|---|---|---|
| 2010/0123174 A1* | 5/2010 | Mao | ............... | H01L 27/14609 |
| | | | | 257/291 |
| 2011/0254115 A1* | 10/2011 | Shih | ............... | H01L 27/14629 |
| | | | | 257/432 |
| 2012/0080765 A1* | 4/2012 | Ku | ............... | H01L 27/1464 |
| | | | | 257/432 |
| 2012/0161270 A1* | 6/2012 | Maehara | ............... | B82Y 10/00 |
| | | | | 257/432 |
| 2013/0056809 A1* | 3/2013 | Mao | ............... | H01L 27/14614 |
| | | | | 257/292 |
| 2013/0146747 A1* | 6/2013 | Hynecek | ............... | H01L 27/1464 |
| | | | | 250/208.1 |
| 2016/0358967 A1* | 12/2016 | Madurawe | ............... | H01L 27/14634 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710163795.1, filed on Mar. 17, 2017, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

Image sensors are usually used to convert an optical signal into a corresponding electrical signal. The image sensor may include complementary metal oxide image sensor (CMOS Image Sensor, CIS) and charge coupled device (CCD) image sensor. CCD image sensors have the advantages of high sensitivity and low noise, but CCD image sensors are difficult to be integrated with other devices, and the power consumption of a CCD image sensor is too large. In contrast, CIS has the advantages of simple processing, easy integration with other devices, small size, light weight, low power consumption, and low cost. At present, CIS has been widely used in static digital cameras, camera phones, digital cameras, medical imaging devices (such as endoscopy), and vehicle camera devices.

The basic photosensitive unit of a CIS is called a pixel, and the pixel includes a photodiode and three or four transistors, referred to as 3T or 4T. The 4T-type CIS is more commonly used, and the corresponding four transistors are reset transistors, amplifiers, select transistors and transfer transistors. Each pixel includes a photosensitive region and a reading region. For commonly used pixels (e.g., 4T pixels), the transfer transistor transfers the signal output from the photosensitive region to the floating diffusion region, and then the signal remains in the floating diffusion region until it is read by the reading components of the pixels.

However, the performance of the pixel structure of a CIS formed by conventional technologies still needs to be improved. The disclosed semiconductor structure and method are directed to solve one or more problems set forth above and other problems.

BRIEF SUMMARY OF THE DISCLOSURE

One aspect of the present disclosure includes a method for fabricating a semiconductor structure. The fabrication method includes: providing a substrate, containing first doping ions and including a pixel region for forming a pixel structure, the pixel region including a photosensitive region and a floating diffusion region adjacent to the photosensitive region; forming a deeply doped region in the photosensitive region of the substrate and containing second doping ions with a type different from the first doping ions; forming a floating diffusion area in the floating diffusion region of the substrate and containing third doping ions with a type different from the first doping ions; forming a gate structure on the substrate at a junction of the photosensitive region and the floating diffusion region; forming a sidewall film covering the gate structure and the substrate; removing the sidewall film on top of the gate structure in the floating diffusion region and on the substrate in the floating diffusion region, thereby forming a sidewall spacer including a remaining sidewall film, on the photosensitive region of the substrate, on the sidewalls of the gate structure, and on top of the gate structure in the photosensitive region; using the sidewall spacer as a mask to form a first doped region in the floating diffusion area on one side of the gate structure, containing fourth doping ions with a type different from the first doping ions; forming a metal connection layer in the first doped region; forming an interlayer dielectric layer on the substrate exposed by the gate structure, the interlayer dielectric layer covering the gate structure; and forming a source/drain contact plug in the interlayer dielectric layer and electrically connected to the metal connection layer.

Another aspect of the present disclosure includes a semiconductor structure. The semiconductor structure includes: a substrate, containing first doping ions and including a pixel region for forming a pixel structure, the pixel region including a photosensitive region and a floating diffusion region adjacent to the photosensitive region; a deeply doped region containing second doping ions with a type different from the first doping ions; a floating diffusion area located in the substrate in the floating diffusion region, containing third doping ions with a type different from the first doping ions; a gate structure located on the substrate at a junction of the photosensitive region and the floating diffusion region; a sidewall spacer on the photosensitive region of the substrate, on the sidewalls of the gate structure, and on top of the gate structure in the photosensitive region; a first doped region in the floating diffusion area on one side of the gate structure, containing fourth doping ions with a type different from the first doping ions; a metal connection layer on the first doped region; an interlayer dielectric layer on the substrate exposed by the gate structure, the interlayer dielectric layer covering the gate structure; and a contact plug, in the interlayer dielectric layer and electrically connected to the metal connection layer.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
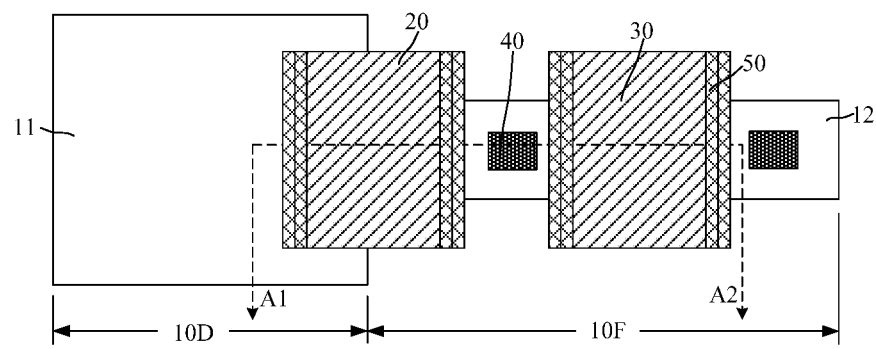
FIG. 1 illustrates the schematic top view of a semiconductor structure.

The performance of the pixel structure of a complementary metal oxide image sensor (CIS) needs to be improved. FIG. 1 illustrates a top view of a semiconductor structure, and FIG. 2 illustrates a schematic cross-sectional view of the structure along the cutting line A1A2 of FIG. 1.

Figure 2:
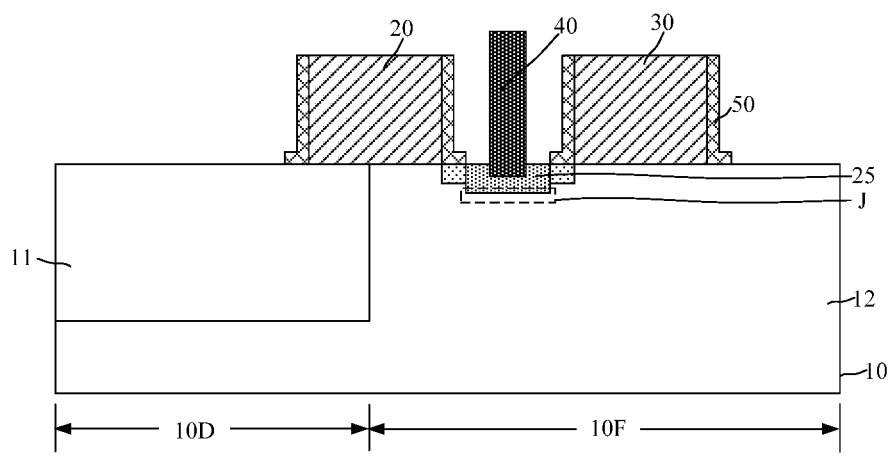
FIG. 2 illustrates a schematic cross-sectional view of the structure along the cutting line A1A2 of FIG. 1.

As shown in FIGS. 1 and 2, the exemplary semiconductor structure is an N-type 4T pixel structure. The semiconductor structure includes a substrate 10 (shown in FIG. 2), and the substrate 10 is P-type doped. The substrate 10 includes a photosensitive region 10D and a floating diffusion region 10F adjacent to the photosensitive region, and the photosensitive region 10D is used to form a photo diode (PD). The semiconductor structure further includes: a deeply doped region 11 located in the photosensitive region 10D of the substrate 10, and the doping type of the deeply doped region 11 being N-type; a floating diffusion region 12 located in the floating diffusion region 10F of the substrate 10, and the doping type of the floating diffusion region 12 being N-type; a first gate structure 20 for forming a transfer transistor (Tx), located on the substrate 10 at a junction of the photosensitive region 10D and the floating diffusion region 10F; a second gate structure 30 for forming a reset transistor, located on the floating diffusion region 10F of the substrate 10; sidewall spacers 50 located on the sidewalls of the first gate structure 20 and the sidewalls of the second gate structure 30; a source/drain doped region 25 located in the floating diffusion region 12 between the first gate structure 20 and the second gate structure 30; an interlayer dielectric layer (not illustrated) located on the substrate 10 exposed by the first gate structure 20 and the second gate structure 30, and the interlayer dielectric layer covering the first gate structure 20 and the second gate structure 30; and a source/drain contact plug 40 located in the interlayer dielectric layer and being electrically connected to the source/drain doped region 25.

The sidewall spacer 50 is formed by: first forming a sidewall film conformally covering the first gate structure 20, the second gate structure 30, and the substrate 10; removing the sidewall film on top of the first gate structure 20, on top of the second gate structure 30, and on the substrate 10; and retaining the sidewall film on the sidewalls of the first gate structure 20 and on the sidewalls of the second gate structure 30 as the sidewall spacer 50. In the process of etching the sidewall film, since the sidewall film on the photosensitive region 10D of the substrate 10 needs to be removed, it is easy to cause plasma damage to the photosensitive region 10D or cause charge remaining in the photosensitive region 10D of the substrate 10, resulting in the problem of damaged pixels.

Further, since a metal silicide process is not employed in the process of forming the pixel structure, it is difficult to control the over-etching amount in the etching process of forming the source/drain contact plug 40, causing a serious over-etching problem and leading to crystal defects. If the over-etching problem is very severe (for example, etching through the source/drain doped region 25), an N/P junction field may be created (as indicated by the dashed line J in FIG. 2, i.e., between the source/drain doped region 25 and the substrate 10), resulting in a dark current problem in the pixel structure. For example, the leakage current of the pixel structure may be increased. Therefore, the performance of the pixel structure in a CIS needs to be improved.

To solve the aforementioned technical problem, the present disclosure provides a method of forming a semiconductor structure. In the disclosed fabrication method, on the one hand, the sidewall film on the photosensitive region of the substrate is retained when forming the sidewall spacer, that is, the sidewall film on the photosensitive region of the substrate is not etched, such that the problems of plasma damage to the photosensitive region and charge remaining in the photosensitive region of the substrate are avoided, thereby avoiding damaged pixels. On the other hand, before forming an interlayer dielectric layer on the substrate, a metal connection layer is formed on the first doped region. The metal connection layer is used as an etching stop position of the etching process when subsequently forming a source/drain contact plug, such that the over-etching of the first doped region of the substrate is avoided, thereby avoiding the dark current problem caused by over-etching, such as leakage current. By combining the above two aspects, the performance of the pixel structure of a CIS can be improved by the technical solution of the present disclosure.

Figure 12:
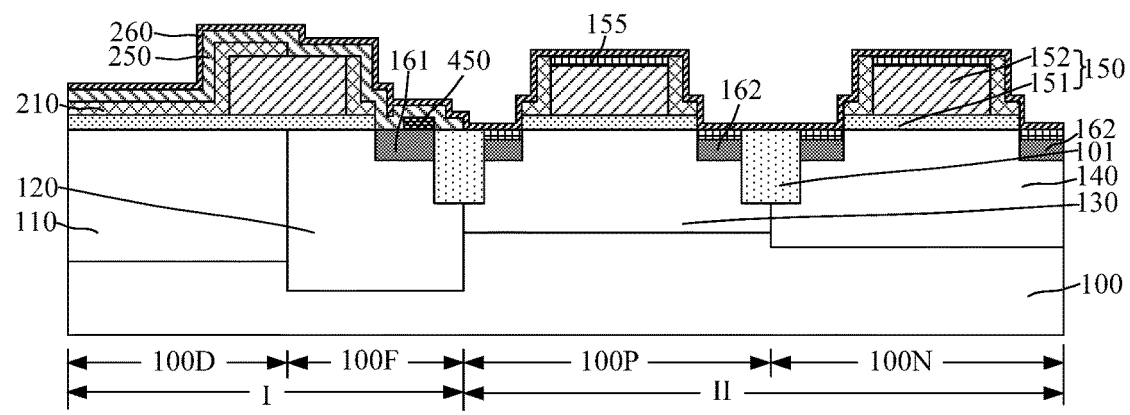
Figure 13:
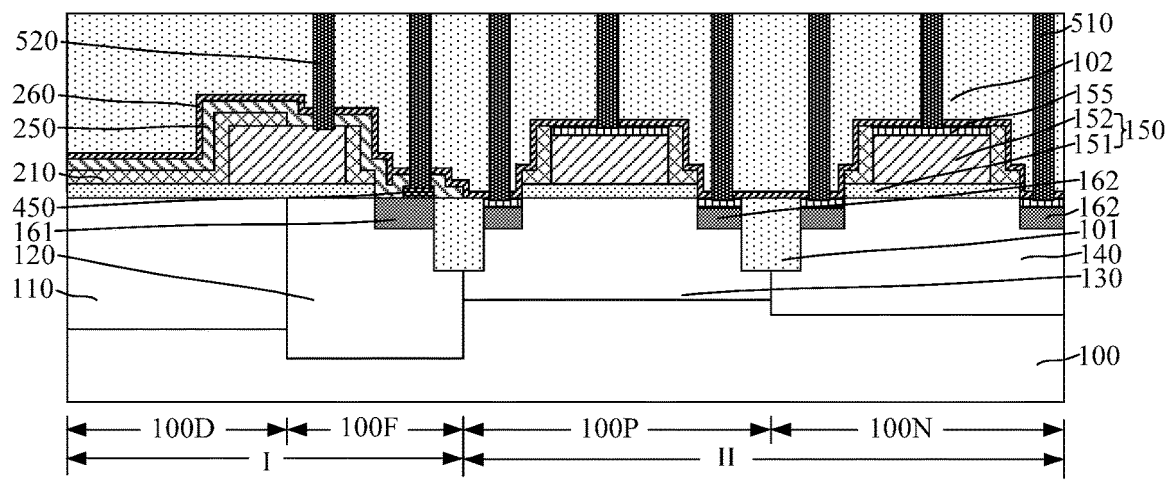
Figure 14:
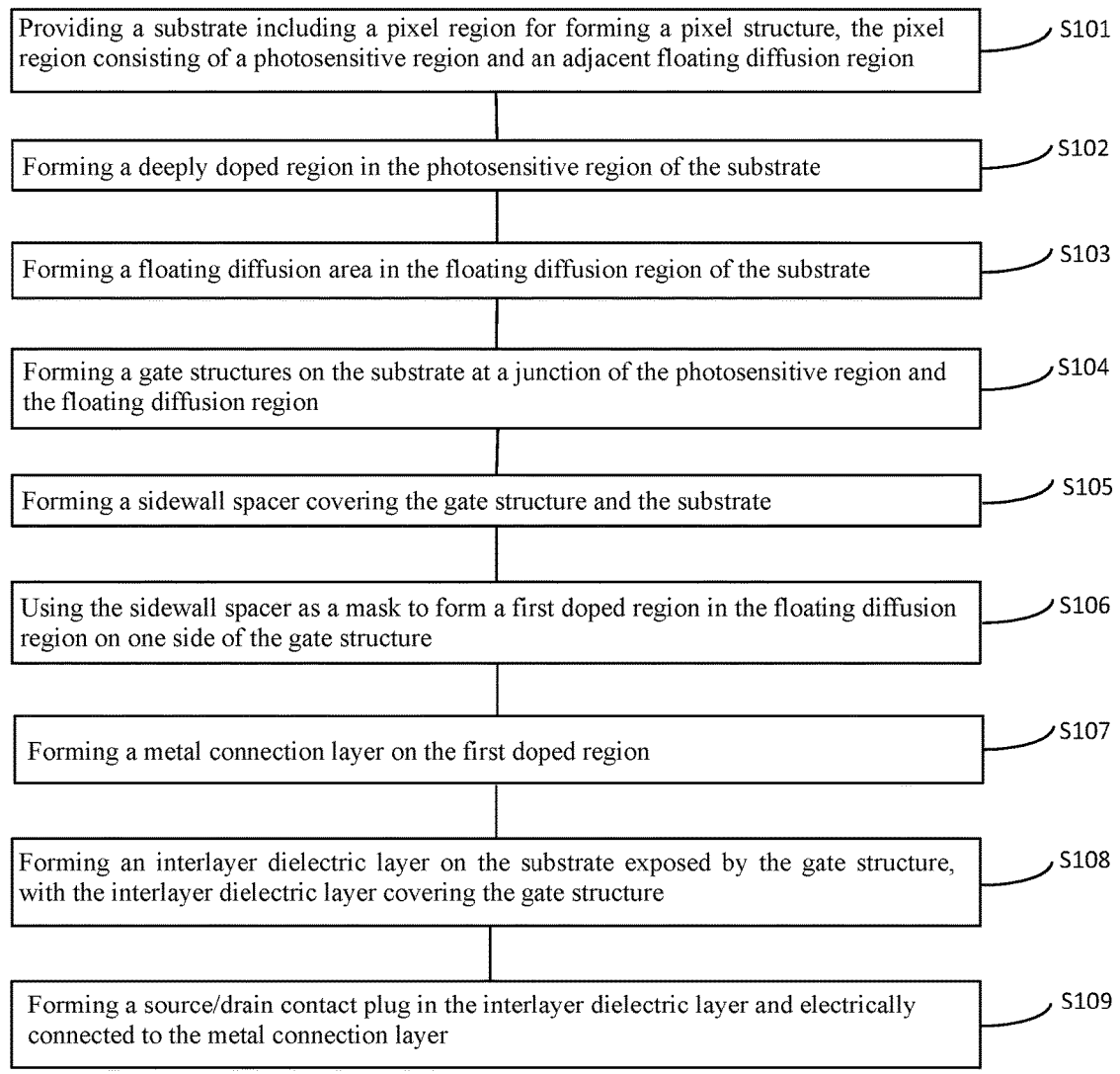
FIG. 14 illustrates an exemplary fabricating process of a semiconductor structure consistent with various disclosed embodiment.

FIG. 14 illustrates an exemplary fabrication process of a semiconductor structure consistent with the disclosed embodiments; and FIGS. 3-13 illustrate schematic structural views of semiconductor structures corresponding to certain stages of the exemplary fabrication process consistent with the disclosed embodiments.

As shown in FIG. 14, at the beginning of the fabrication process, a substrate is provided and the substrate includes a pixel region for forming a pixel structure (S101). The pixel region includes a photosensitive region and a floating diffusion region adjacent to the photosensitive region.

Figure 3:
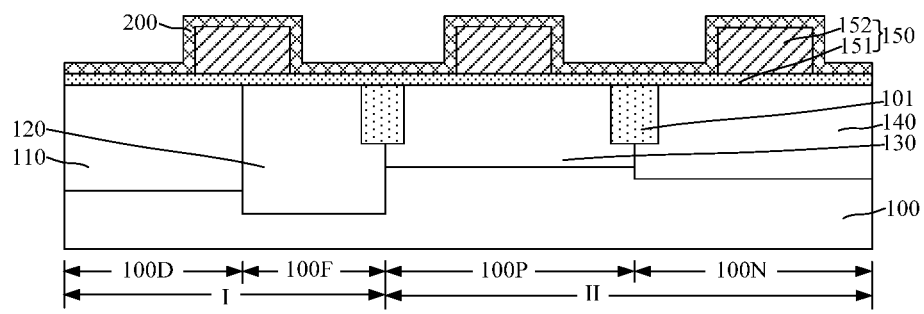
FIGS. 3~13 illustrate schematic structural views of a semiconductor structure corresponding to certain stages of a fabrication process consistent with various disclosed embodiment.

As shown in FIG. 3, a substrate 100 is provided, and the substrate 100 includes a pixel region I for forming a pixel structure. The pixel region I includes a photosensitive region 100D and a floating diffusion region 100F adjacent to the photosensitive region 100D. First doping ions are contained in the substrate 100.

The pixel structure is a portion of the complementary metal oxide image sensor (CMOS Image Sensor, CIS). The substrate 100 provides a processing platform for subsequently forming the pixel structure.

In one embodiment, the substrate 100 is made of silicon. In other embodiments, the substrate may also be made of germanium, germanium silicon, silicon carbide, gallium arsenide, indium gallium, silicon-on-insulator, or germanium-on-insulator. The substrate may also be made of any other material suitable for processing requirements or for easy integration.

There are first doping ions in the substrate, and the doping type of the substrate 100 is selected according to the type of the formed pixel structure. In one embodiment, the pixel structure of the formed CIS is N-type. Correspondingly, the substrate 100 is a P-type substrate 100, i.e., the first doping ions are P-type ions, for example, one or more of the boron ion, gallium ion, and indium ion.

In other embodiments, the formed pixel structure may also be P-type. Correspondingly, the substrate is an N-type substrate, i.e. the first doping ions are N-type ions, such as one or more of the phosphorous ion, arsenic ion, and antimony ion.

In an exemplary embodiment, the substrate 100 further includes a logic region II for forming a logic device. In one embodiment, the formed logic device is a CMOS device. The logic region II includes a PMOS region 100P for forming a P-type device and an NMOS region 100N for forming an N-type device. In other embodiments, the logic region may also include only a PMOS region or only an NMOS region.

In one embodiment, the PMOS region 100P and the NMOS region 100N are adjacent to each other. In other embodiments, the PMOS region and the NMOS region may also be isolated from each other.

As shown in FIG. 3, after providing the substrate 100, the fabrication method further includes forming a plurality of isolation structures 101 in the substrate 100 at the junction between the floating diffusion region 100F and the logic region II, and in the substrate 100 at the junction of the PMOS region 100P and the NMOS region 100N.

The isolation structure 101 is used to isolate adjacent devices. In one embodiment, the isolation structure 101 is made of silicon oxide. In other embodiments, the isolation structure may also be made of silicon nitride or silicon oxynitride.

Returning to FIG. 14, after providing a substrate, the fabrication method further includes forming a deeply doped region in the photosensitive region of the substrate (S102).

As shown in FIG. 3, a deeply doped region 110 is formed in the photosensitive region 100D of the substrate 100. Second doping ions are contained in the deeply doped region 110, and the type of the second doping ions is different from the type of the first doping ions.

The deeply doped region 110 is used as a portion of the photodiode of the subsequently formed pixel structure.

In one embodiment, the first doping ions are P-type ions, and accordingly, the second doping ions are N-type, such as one or more of the phosphorus ion, arsenic ion, and antimony ion. For example, N-type ions are doped into the photosensitive region 100D of the substrate 100 by an ion implantation process.

Returning to FIG. 14, after forming a deeply doped region, the fabrication method further includes forming a floating diffusion area in the floating diffusion region of the substrate (S103).

As shown in FIG. 3, a floating diffusion area 120 is formed in the floating diffusion region 100F of the substrate 100. Third doping ions are contained in the floating diffusion area 120, and the third doping ions and the first doping ions have different types.

The floating diffusion area 120 is used to accumulate signal charge during the operation of a CIS.

In one embodiment, the first doping ions are P-type ions, and the third doping ions are N-type ions, such as one or more of the phosphorus ion, arsenic ion, and antimony ion. The N-type ions are doped into the floating diffusion region 100F of the substrate 100 by an ion implantation process.

As shown in FIG. 3, the substrate 100 further includes a logic region II for forming a logic device. After forming the isolation structure 101, the fabrication method further includes forming a well region (not illustrated) in the logic region II of the substrate 100.

In one embodiment, the process of forming the well region includes forming a first well region 130 in the PMOS region 100P of the substrate 100; forming a second well region 140 in the NMOS region 100N of the substrate 100. Through an ion implantation process, the N-type ions are doped into the PMOS region 100P of the substrate to form the first well region 130, and the P-type ions are doped into the NMOS region 100N of the substrate 100 to form the second well region 140.

In one exemplary embodiment, the deeply doped region 110 and the floating diffusion area 120 are formed first, and then the first well region 130 and the second well region 140 are formed. In the disclosure, there is no limitation on the sequence of forming the deeply doped region 110, the floating diffusion area 120, the first well region 130, and the second well region 140.

In other embodiments, if the formed pixel structure is P-type, accordingly the second doping ions are P-type ions, and the third doping ions are P-type ions.

Returning to FIG. 14, after forming the floating diffusion region, the fabrication method further includes forming a plurality of gate structures on the substrate (S104).

As shown in FIG. 3, a gate structure 150 is formed on the substrate 100 at the junction of the photosensitive region 100D and the floating diffusion region 100F.

The gate structure 150 on the substrate 100 at the junction of the photosensitive region 100D and the floating diffusion region 100F is used for subsequently forming the transfer transistor (Tx) of the pixel structure.

In one embodiment, the gate structure 150 is a stacked structure. The gate structure 150 includes a gate oxide layer 151 and a gate electrode layer 152 on the gate oxide layer 151. The gate electrode layer 152 may be made of polysilicon, silicon oxide, silicon nitride, silicon oxynitride, silicon carbide, silicon carbonitride, carbon oxynitride or amorphous carbon, and the gate oxide layer 151 may be made of silicon oxide or silicon oxynitride. In one exemplary embodiment, the gate oxide layer 151 is made of silicon oxide, and the gate electrode layer 152 is made of polysilicon.

The process of forming the gate structure 150 includes: forming a gate oxide layer 151 on the substrate 100 after forming the isolation structure 101, the deeply doped region 110, the floating diffusion area 120, the first well region 130, and the second well region 140; forming a gate film on the gate oxide layer 151; forming a gate mask layer on the gate film (not illustrated); using the gate mask layer as a mask to pattern the gate film, leaving the remaining gate film as the gate electrode layer 152, and the gate oxide layer 151 and the gate electrode layer 152 as the gate structure 150; and removing the gate mask layer.

In other embodiments, the gate structure may also be a single layer structure, and accordingly, the gate structure includes only a gate electrode layer.

In one embodiment, in the process of forming the gate structure 150 on the substrate 100 at the junction of the photosensitive region 100D and the floating diffusion region 100F, a plurality of gate structures 150 are also formed in the logic region II of the substrate 100. For example, the gate structures 150 are formed on the PMOS region 100P of the substrate 100 and on the NMOS region 100N of the substrate 100, respectively.

The gate structure 150 in the PMOS region 100P is used to control the conduction and cutoff of the channel of the formed P-type device, and the gate structure 150 in the NMOS region 100N is used to control the conduction and cutoff of the channel of the N-type device.

Returning to FIG. 14, the fabrication method further includes forming a sidewall spacer (S105).

As shown in FIG. 3, a sidewall film 200 conformally covering the gate structures 150 and the substrate 100 is formed.

The sidewall film 200 provides a processing basis for subsequently forming the sidewall spacer.

The sidewall film 200 may be made of silicon oxide, silicon nitride, silicon carbide, silicon carbonitride, silicon oxynitride, silicon oxynitride, boron nitride or boron carbon nitride, and the sidewall film 200 may be a single layer structure or a stacked structure. In one embodiment, the sidewall film 200 is an oxide-nitride-oxide (ONO) stacked structure, that is, the sidewall film 200 includes a first silicon oxide film, a silicon nitride film on the first silicon oxide film, and a second silicon oxide film on the silicon nitride film.

In one embodiment, the sidewall film 200 is formed by an atomic layer deposition process, and the sidewall film 200 has good step coverage ability. Correspondingly, the sidewall film 200 conformally covers the gate structures 150 in the pixel region I and the logic region II and the substrate 100.

The gate structure 150 includes a gate oxide layer 151 on the substrate 100 and a patterned gate electrode layer 152 on the gate oxide layer 151, such that the sidewall film 200 conformally covers the gate oxide layer 151 and the gate electrode layer 152.

Figure 4:
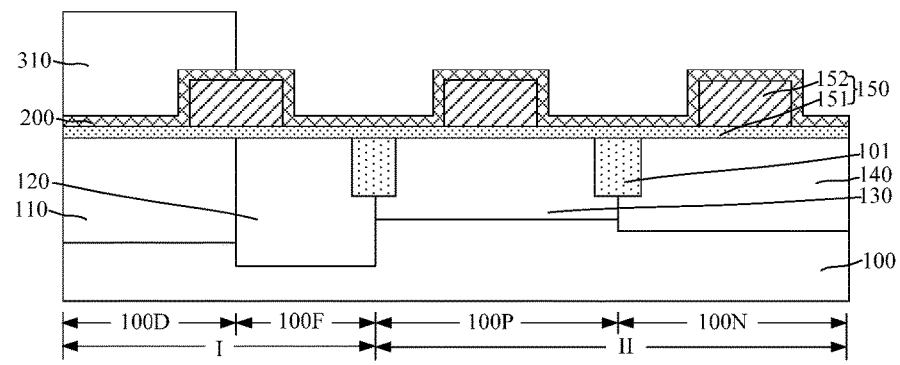
Figure 5:
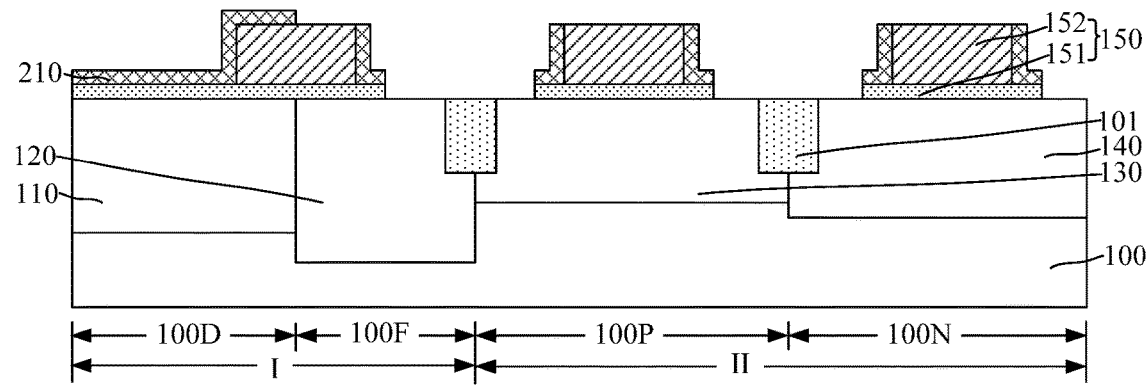

As shown in FIGS. 4 and 5, the sidewall film 200 (shown in FIG. 4) on the top of the gate structure 150 in the floating diffusion region 100F and on the floating diffusion region 100F of the substrate 100 is removed while retaining the sidewall film 200 on the photosensitive region 100D of the substrate 100, on the sidewalls of the gate structures 150, and on the top of the gate structure 150 in the photosensitive region 100D, leaving the remaining sidewall film 200 as the sidewall spacer 210 (as shown in FIG. 5).

The sidewall spacer 210 is used to define the location of the subsequently formed source/drain doped region and to protect the gate structures 150.

In one embodiment, the sidewall film 200 is an oxide-nitride-oxide (ONO) stacked structure, and accordingly, the sidewall spacer 210 is also an ONO stacked structure. That is, the sidewall spacer 210 includes a first silicon oxide layer, a silicon nitride layer on the first silicon oxide layer, and a second silicon oxide layer on the silicon nitride layer.

The process of forming the sidewall spacer 210 includes: forming a first pattern layer 310 (as shown in FIG. 4) on the sidewall film 200 in the photosensitive region 100D; using the first pattern layer 310 as a mask to etch the sidewall film 200 on the top of the gate structure 150 in the floating diffusion region 100F and on the floating diffusion region 100F of substrate 100, leaving the remaining sidewall film 200 as the sidewall spacer 210; and after forming the sidewall spacer 210, removing the first pattern layer 310.

In one embodiment, the sidewall film 200 on the top of the gate structure 150 located in the floating diffusion region 100F and on the floating diffusion region 100F of the substrate 100 is removed by a plasma dry etching process to retain the sidewall film 200 on the sidewalls of the gate structure 150.

In the process of forming the sidewall spacer 210, the sidewall film 200 on the top of the gate structure 150 in the logic region II and on the logic region II of the substrate 100 is also removed. That is, the sidewall spacer 210 is also located on the sidewalls of the gate structures 150 in the logic region II, i.e., on the sidewalls of the gate structure 150 in the NMOS region 100N and on the sidewalls of the gate structure 150 in the PMOS region 100P.

After forming the sidewall spacer 210, the gate oxide layer 151 exposed by the sidewall spacer 210 is also removed, and a portion of the substrate 100 is exposed by the gate structure 150.

Returning to FIG. 14, the fabrication method further includes forming a first doped region in the floating diffusion area on one side of the gate structure (S106).

Figure 6:
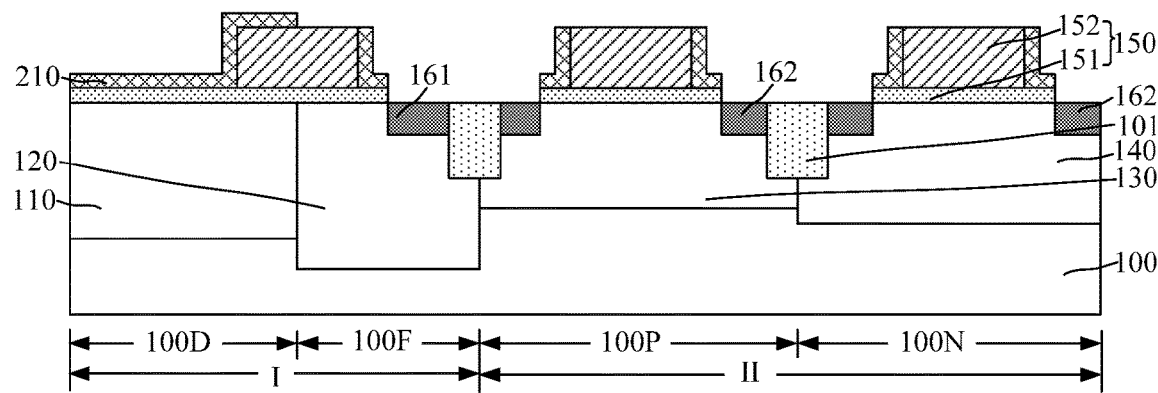

As shown in FIG. 6, a first doped region 161 is formed in the floating diffusion area 120 on one side of the gate structure 150 using the sidewall spacer 210 as a mask. Fourth doping ions are contained in the first doped region 161, and the type of the fourth doping ions is different from the type of first doping ions.

The first doped region 161 is used as the drain of the formed transfer transistor to extract the electrons generated by the photoelectric effect of the photodiode after turning on the formed transfer transistor.

In one embodiment, the first doping ions are P-type ions, and the fourth doping ions are N-type ions, such as one or more of the phosphorus ion, arsenic ion, and antimony ion. The N-type ions are doped into the floating diffusion area 120 on one side of the gate structure 150 by an ion implantation process. In other embodiments, if the formed pixel structure is P-type, the fourth doping ions are P-type ions, such as one or more of the boron ion, gallium ion, and indium ion.

After forming the sidewall spacer 210, the fabrication method further includes forming the second source/drain doped regions 162 in the substrate 100 on both sides of the gate structure 150 in the logic region II. The second source/drain doped region 162 in the PMOS region 100P is used as the source or drain of the formed P-type device, and the second source/drain region 162 in the NMOS region 100N is used as the source or drain of the formed N-type device.

By an ion implantation process, the P-type ions are doped into the substrate 100 on both sides of the gate structure 150 in the PMOS region 100P, and the N-type ions are doped into the substrate 100 on both sides of the gate structure in the NMOS region 100N.

Returning to FIG. 10, the fabrication method further includes forming a metal connection layer in the first doped region (S107).

Figure 7:
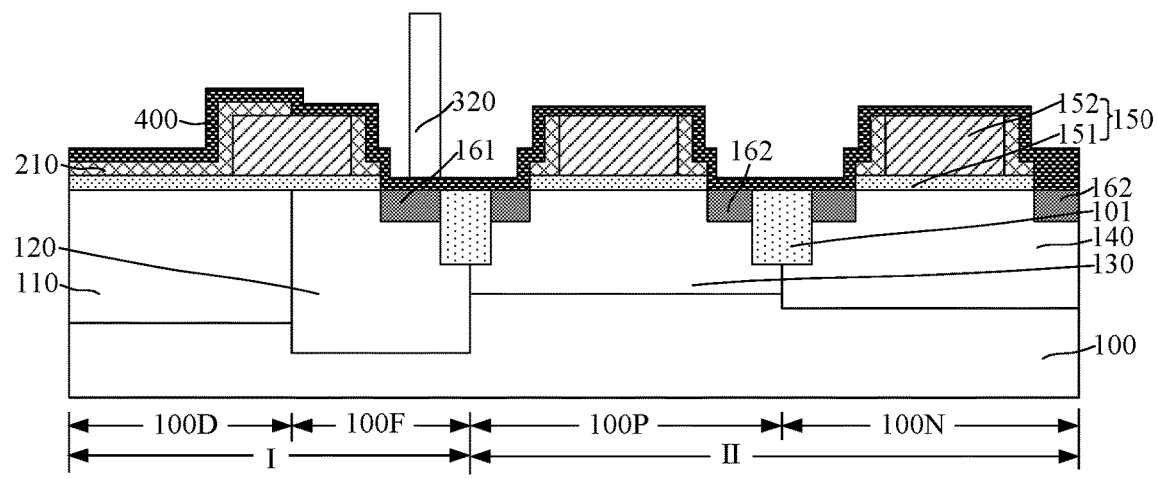
Figure 8:
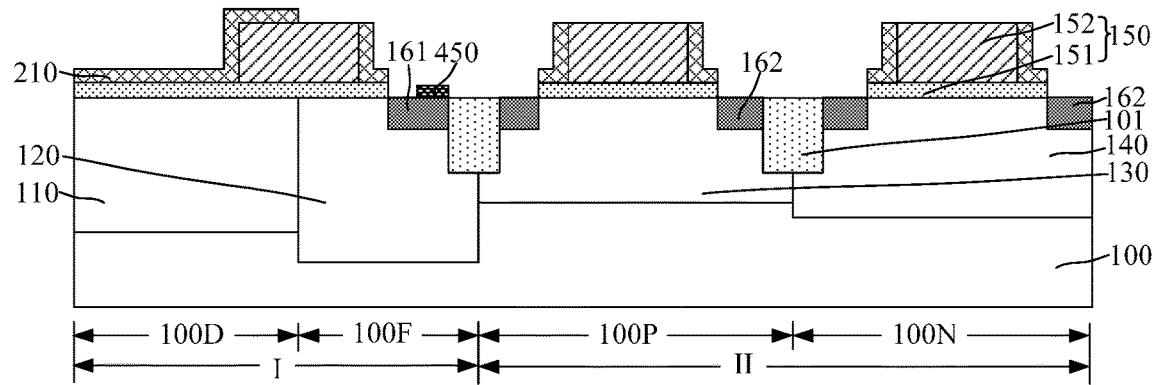

As shown in FIGS. 7 and 8, a metal connection layer 450 is formed on the first source/drain region 161 (see FIG. 8).

The metal connection layer 450 is used as an etching stop position of the etching process when subsequently forming the source/drain contact plug in the pixel region I, avoiding over-etching the substrate 100 corresponding to the first doped region 161 and the dark current problem caused by over-etching, such as leakage current.

In one embodiment, the metal connection layer 450 may be made of one or more of Ti, TiN, W, Ta, TaN, and Al.

The metal connection layer 450 is made of a conductive material. The metal connection layer 450 is not only used as an etching stop position, but also for electrically connecting the subsequently formed source/drain contact plug and the first source/drain region. Accordingly, as the metal connection layer 450 is introduced, the electrical connection between the source/drain contact plug and the first doped region 161 can still be achieved.

The thickness of the metal connection layer 450 should neither be too small nor too large. If the thickness of the metal connection layer 450 is too small, it is difficult to satisfactorily act as an etching stop layer during the subsequent etching process of forming the source/drain contact plug, and the risk of over-etching the substrate corresponding to the first doped region will be increased; if the thickness of the metal connection layer 450 is too large, the distance between the contact plug and the first doped region 161 along the direction normal to the surface of the substrate 100 is increased, adversely affecting the performance of the formed pixel structure. As such, in one embodiment, the thickness of the metal connection layer 450 is in a range of 500 Å to 1000 Å.

In one embodiment, the metal connection layer 450 is formed by a physical vapor deposition process. In particular, the process of forming the metal connection layer 450 includes: forming a metal film 400 (shown in FIG. 7) conformally covering the sidewall spacer 210, the gate structures 150 and the substrate 100; forming a second pattern layer 320 (as shown in FIG. 7) on the metal film 400 above the first doped region 161; using the second pattern layer 320 as a mask to etch the metal film 400 and form the metal connection layer 450; and removing the second pattern layer 320.

In one embodiment, the process of etching the metal film 400 is a wet etching process, and the etching solution used in the wet etching process is dependent on the material of the metal film 400, that is, dependent on the material of the metal connection layer 450. Compared with the method in which the metal film is etched by a dry etching process, the problem of the charge remaining in the pixel region I is avoided and the dark current of the formed pixel structure is reduced by using a wet etching process.

In one embodiment, the metal connection layer 450 covers a portion of the surface of the first doped region 161. In other embodiments, the metal connection layer may also cover the entire surface of the first doped region.

Returning to FIG. 14, the fabrication method further includes forming an interlayer dielectric layer on the substrate exposed by the gate structures (S108).

Figure 11:
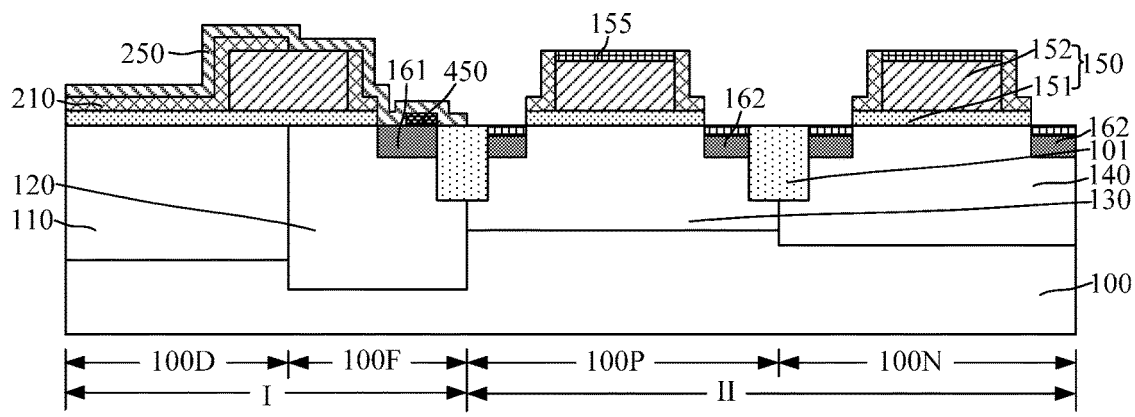

As shown in FIGS. 9 to 13, after forming the metal connection layer 450, an interlayer dielectric layer 102 is formed on the substrate 100 exposed by the gate structure 150 (as shown in FIG. 13), and the interlayer dielectric layer 102 covers the gate structures 150.

The interlayer dielectric layer 102 is used to electrically isolate the semiconductor structures and also to provide a processing basis for subsequently forming the source/drain contact plug.

The interlayer dielectric layer 102 is made of an insulating, such as a dielectric material like silicon oxide, silicon nitride, silicon oxynitride, silicon oxynitride, silicon carbide, or silicon oxynitride. In one embodiment, the interlayer dielectric layer 102 is made of silicon oxide.

Figure 9:
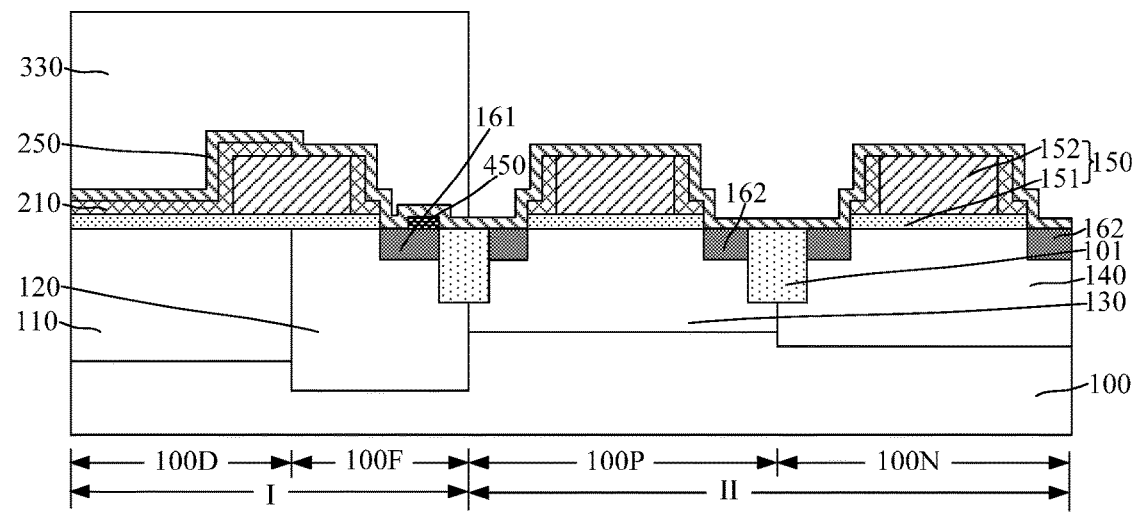
Figure 10:
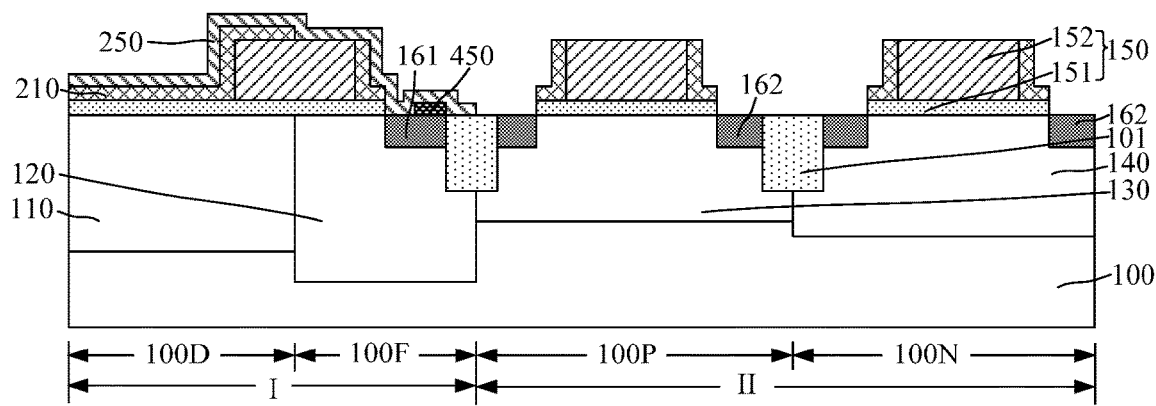

As shown in FIGS. 9 to 11, after forming the metal connection layer 450 and before forming the interlayer dielectric layer 102 (as shown in FIG. 9) on the substrate, the fabrication method further includes: forming a silicide block 250 conformally covering the first sidewall spacer 210, the gate structures 150, the first doped region 161, the second source/drain doped regions 162, and the metal connection layer 450; forming a third pattern layer 330 (as shown in FIG. 9) on the silicide block 250 in the pixel region I; using the third pattern layer 330 as a mask to remove the silicide block 250 in the logic region II; removing the third pattern layer 330; after removing the third pattern layer 330, forming a metal silicide layer 155 on the top of the gate structures 150 in the logic region II and on the second source/drain region.

In one embodiment, the third pattern layer 330 is made of a photoresist. The third pattern layer 330 is removed by a wet glue or an ashing process.

The silicide block 250 is used to prevent formation of the metal silicide layer 155 in the pixel region I. The silicide block 250 may be made of one or both of silicon oxide and silicon nitride. In one embodiment, the silicide block 250 is made of silicon-rich silicon oxide (SRO), and the silicon-rich silicon oxide refers to silicon oxide with a high concentration of silicon.

In one embodiment, in the process of forming the metal silicide layer 155, the metal silicide layer 155 on the top of the gate structures 150 is converted from a partial thickness of the gate structures 150, and the metal silicide layer 155 on the second source/drain doped region 162 is converted from a partial thickness of the substrate 100 corresponding to the second source/drain doped region 162.

The metal silicide layer 155 is used to reduce the contact resistance. In one embodiment, the metal silicide layer 155 may be made of TiSi or NiSi.

As shown in FIG. 12, after forming the metal silicide layer 155 and before forming the interlayer dielectric layer 102, the fabrication method further includes forming an etching stop layer 260 conformally covering the silicide block 250, the isolation structure 101, the metal silicide layer 155, and the sidewall spacer 210.

The etching stop layer 260 is used as an etching stop position for the etching process when subsequently forming the source/drain contact plug, such that the insufficient etching or over-etching due to the incompatibility of the etching rates in different regions can be avoided. In one embodiment, the etching stop layer 260 is made of silicon nitride.

Therefore, in the process of forming the interlayer dielectric layer 102 on the substrate 100, the interlayer dielectric layer 102 is formed on the etching stop layer 260.

Returning to FIG. 14, after forming an interlayer dielectric layer, the fabrication method further includes forming a plurality of source/drain contact plugs in the interlayer dielectric layer electrically connected to the metal connection layer (S109).

As shown in FIG. 13, a plurality of source/drain contact plugs 510 are formed in the interlayer dielectric layer 102, and respectively above the first doped region 161 and the second source/drain regions 162.

For example, one of the plurality of source/drain contact plugs 510 is formed in the pixel region I to electrically connect to the first doped region 161 through the metal connection layer 450 to achieve electrical connection within the semiconductor device and between the devices.

In the process of forming the source/drain contact plugs 510 electrically connected to the metal connection layer 450 in the interlayer dielectric layer 102, the source/drain contact plugs 510 are also formed in the interlayer dielectric layer in the logic region II, and the source/drain contact plugs 510 in the logic region II are electrically connected to the second source/drain regions 162.

After forming the interlayer dielectric layer 102, the fabrication method further includes: forming a plurality of gate contact plugs 520 electrically connected to the gate structures 150 in the interlayer dielectric layer 102. The gate contact plugs 520 are electrically connected to the gate structures 150 in the pixel region I and the logic region II, respectively, to achieve electrical connection within the semiconductor device and between the devices.

In one embodiment, the source/drain (S/D) contact plugs 510 and the gate contact plugs 520 are formed in the same process.

The process of forming the source/drain contact plugs 510 and the gate contact plugs 520 includes: etching the interlayer dielectric layer 102, forming a plurality of first contact holes (not illustrated) in the interlayer dielectric layer 102 above the first doped region 161 and the second source/drain doped regions 162 exposing the etching stop layer 260 and forming a plurality of second contact holes (not illustrated) in the interlayer dielectric layer 102 above the gate structures 150 exposing the etching stop layer 260; etching the etching stop layer 260 and the silicide block 250 along the first contact hole in the pixel region I to expose the metal connection layer 450; etching the etching stop layer 260 along the first contact holes in the logic region II to expose the metal silicide layer 155; etching the etching stop layer 260 and the silicide block 250 along the second contact hole in the pixel region I to expose the gate structure 150; etching the etching stop layer 260 along the second contact holes in the logic region II to expose the metal silicide layer 155. The first contact holes expose the metal connection layer 450 and the metal silicide layer 155, and the second contact holes expose the gate structure 150 and the metal silicide layer 155. The fabrication method further includes filling the first contact holes and the second contact holes with a conductive material. The conductive material may also be located on the top of the interlayer dielectric layer 102. The conductive material located at the top of the interlayer dielectric layer 102 is then removed. The remaining conductive material within the first contact holes forms the source/drain contact plugs 510, and the remaining conductive material in the second contact holes forms the gate contact plugs 520.

Accordingly, the present disclosure also provides a semiconductor structure.

FIG. 13 illustrates a schematic structural view of an embodiment of the semiconductor structure of the present disclosure.

The semiconductor structure includes a substrate 100, and the substrate 100 includes a pixel region I for forming a pixel structure. The pixel region I includes a photosensitive region 100D and a floating diffusion region 100F adjacent to the photosensitive region, and first doping ions are contained in the substrate 100. The semiconductor structure further includes a deeply doped region 110 in the photosensitive region 100D of the substrate 100, containing second doping ions with a type different from the first doping ions; a floating diffusion area 120 in the floating diffusion region 100F of the substrate 100, containing third doping ions with a type different from the first doping ions; a gate structure 150 located on the substrate 100 at the junction of the photosensitive region 100D and the floating diffusion region 100F; a sidewall spacer 210 on the photosensitive region 100D of the substrate 100, on the sidewalls of the gate structure 150, and on the top of the gate structure 150 in the photosensitive region 100D; a first doped region 161 located in the floating diffusion area 120 on one side of the gate structure 150, containing fourth doping ions with a type different from the first doping ions; a metal connection layer 450 located on the first doped region 161; an interlayer dielectric layer 102 on the substrate 100 exposed by the gate structure 150, with the interlayer dielectric layer 102 covering the gate structures 150; a source/drain contact plug 510 in the interlayer dielectric layer 102 and electrically connected to the metal connection layer 450.

A complementary metal oxide image sensor (CMOS Image Sensor, CIS) is located on the substrate 100, and the pixel structure is a part of the CIS. The substrate 100 provides a processing platform for the formation of the pixel structure.

In one embodiment, the substrate 100 is made of silicon. In other embodiments, the substrate may also be made of germanium, germanium silicon, silicon carbide, gallium arsenide, or indium gallium, silicon-on-insulator or germanium-on-insulator. The substrate may also be made of any other appropriate material suitable for processing requirements or for easy integration.

The first doping ions are contained in the substrate 100. The doping type of the substrate 100 is selected according to the type of the pixel structure. In one embodiment, the pixel structure is N-type, and correspondingly, the substrate 100 is a P-type substrate 100. That is, the first doping ions are P-type ions, such as one or more of the boron ion, gallium ion, and indium ion.

In other embodiments, the pixel structure may also be P-type, and correspondingly, the substrate is an N-type substrate. That is, the first doping ions are N-type ions, such as one or more of the phosphorus ion, arsenic ion, and antimony ion.

The substrate 100 further includes a logic region II having a logic device. In one exemplary embodiment, the logic device is a CMOS device. The logic region II includes a PMOS region 100P having a P-type device and an NMOS region 100N having an N-type device. In other embodiments, the logic region may also include only a PMOS region or only an NMOS region.

In one embodiment, the PMOS region 100P and the NMOS region 100N are adjacent to each other. In other embodiments, the PMOS region and the NMOS region may also be isolated from each other.

The semiconductor structure further includes an isolation structure 101, and the isolation structure is located in the substrate 100 at the junction of the floating diffusion region 100F and the logic region II, and in the substrate 100 at the junction of the PMOS regions 100P and NMOS region 100N.

The isolation structure 101 is used to isolate adjacent devices. In one embodiment, the isolation structure 101 is made of silicon oxide. In other embodiments, the isolation structure may also be made of silicon nitride or silicon oxynitride.

The deeply doped region 110 is a part of the photodiode of the pixel structure. In one embodiment, the first doping ions are P-type ions, and the second doping ions are N-type ions, such as one or more of the phosphorus ion, arsenic ion, and antimony ion.

The floating diffusion area 120 is used to accumulate signal charge during the operation of the CIS. In one embodiment, the first doping ions are P-type, and correspondingly, the third doping ions are N-type, such as one or more of the phosphorus ions, arsenic ions and antimony ions.

The semiconductor structure further includes a well region (not illustrated) in the logic region II of the substrate 100. The well region includes a first well region 130 in the PMOS region 100P of the substrate 100 and a second well region 140 in the NMOS region 100N of the substrate 100. In one embodiment, the doping ions in the first well region 130 are N-type ions, and the doping ions in the second well region 140 are P-type ions.

In other embodiments, if the pixel structure is P-type, the second doping ions are P-type and the third doping ions are P-type.

The gate structure 150 on the substrate 100 at the junction of the photosensitive region 100D and the floating diffusion region 100F is used as a part of the transfer transistor (Tx) of the pixel structure.

In one embodiment, the gate structure 150 is a stacked structure, and the gate structure 150 includes a gate oxide layer 151 and a gate electrode layer 152 on the gate oxide layer 151. The gate electrode layer 152 may be made of polysilicon, silicon oxide, silicon nitride, silicon oxynitride, silicon carbide, silicon carbonitride, carbon oxynitride or amorphous carbon, and the gate oxide layer 151 may be made of silicon oxide or silicon oxynitride. In one embodiment, the gate oxide layer 151 is made of silicon oxide, and the gate electrode layer 152 is made of polysilicon.

In other embodiments, the gate structure may also be a single layer structure, and accordingly, the gate structure includes only a gate electrode layer.

The gate structures 150 are also located on the substrate 100 in the logic region II. Specifically, the gate structures 150 are located on the PMOS region 100P of the substrate 100 and also on the NMOS region 100N of the substrate 100. The gate structure 150 in the PMOS region 100P is used to control the conduction and cutoff of the channel of the P-type device, and the gate structure 150 in the NMOS region 100N is used to control the conduction and cutoff of the channel of the N-type device.

The sidewall spacer 210 is used to define the position of the first doped region 161 and to protect the formed gate structure 150.

The sidewall 210 may be made of silicon oxide, silicon nitride, silicon carbide, silicon carbonitride, silicon oxynitride, silicon oxynitride, boron nitride or boron carbon nitride, and the sidewall spacer 210 may be a single layer structure or a stacked structure. In one embodiment, the sidewall spacer 210 is an oxide-nitride-oxide (ONO) stacked structure, and the sidewall spacer 210 includes a first silicon oxide layer, a silicon nitride layer on the first silicon oxide layer, and a second silicon oxide layer on the silicon nitride layer.

In one embodiment, the sidewall spacer 210 is also located on the sidewalls of the gate structures 150 in the logic region II, that is, on the sidewalls of the gate structure 150 in the NMOS region 100N and on the sidewalls of the gate structure 150 in the PMOS region 100P.

The first doped region 161 is used as the drain of the transfer transistor to extract the electrons generated by the photoelectric effect of the photodiode after the transfer transistor is turned on. In one embodiment, the first doping ions are P-type, and the fourth doping ions are N-type, such as one or more of the phosphorus ions, arsenic ions and antimony ions. In other embodiments, if the pixel structure is P-type, the fourth doping ions are P-type, such as one or more of the boron ions, gallium ions, and indium ions.

In one embodiment, the semiconductor structure further includes the second source/drain doped regions 162 in the substrate 100 on both sides of the gate structures 150 in the logic region II. Specifically, the second source/drain doped region 162 in the PMOS region 100P is located in the substrate 100 on both sides of the gate structure 150 in the PMOS region 100P, and the second source/drain doped region 162 of the NMOS region 100N is located in the substrate 100 on both sides of the gate structure 150 in the NMOS region 100N. The second source/drain doped region 162 in the PMOS region 100P is used as a source or drain of the P-type device, and the second source/drain doped region 162 in the NMOS region 100N is used as a source or drain of the N-type device. In one embodiment, the doping ions of the second source/drain doped region 162 in the PMOS region 100P are P-type, and the doping ions of the second source/drain doped region 162 in the NMOS region 100N are N-type.

The metal connection layer 450 is as an etching stop position of the etching process during the formation of the first doped region 161 in the pixel region I, thereby avoiding over-etching the substrate 100 corresponding to the first doped region in the pixel region I and avoiding the dark current problem caused by over-etching, such as leakage current. In one embodiment, the metal connection layer 450 may be made of one or more of Ti, TiN, W, Ta, TaN and Al.

The metal connection layer 450 is made of a conductive material, and thus the metal connection layer 450 can not only act as an etching stop layer, but also electrically connect the first doped region 161 and the source/drain contact plug 510. Accordingly, the electrical connection between the first doped region 161 and the source/drain contact plug 510 can still be achieved by introducing the metal connection layer 450.

The thickness of the metal connection layer 450 should neither be too small nor too large. If the thickness of the metal connection layer 450 is too small, it is difficult to satisfactorily act as an etching stop material during the etching process of forming the source/drain contact plugs 510, and can increase the risk of over-etching the substrate corresponding to the first doped region in the pixel region I. If the thickness of the metal connection layer 450 is too large, the distance between the source/drain contact plug 510 and the first doped region 161 in the direction normal to the surface of the substrate 100 is increased, adversely affecting the performance of the pixel structure. In one embodiment, the thickness of the metal connection layer 450 is in a range of from about 500 Å to about 1000 Å.

In one embodiment, the metal connection layer 450 covers a portion of the surface of the first doped region 161. In other embodiments, the metal connection layer may also cover the entire surface of the first doped region.

The interlayer dielectric layer 102 is used to achieve electrical isolation between semiconductor structures and also to provide a processing basis for the formation of the first doped region 161. The interlayer dielectric layer 102 is made of an insulator like a dielectric material, such as silicon oxide, silicon nitride, silicon oxynitride, silicon oxynitride, silicon carbide or silicon oxynitride. In one embodiment, the interlayer dielectric layer 102 is made of silicon oxide.

The source/drain contact plug 510 is electrically connected to the first doped region 161 through the metal connection layer 450 to achieve electrical connection within the semiconductor device and also between the devices.

The source/drain contact plugs 510 are also located in the interlayer dielectric layer 102 in the logic region II, and the source/drain contact plugs 510 in the logic region II and the second source/drain doped regions 162 are electrically connected.

The semiconductor structure further includes a gate contact plug 520 located within the interlayer dielectric layer 102 and electrically connected to the gate structure 150 in the pixel region I. In one embodiment, the gate contact plugs 520 are also electrically connected to the gate structures 150 in the logic region II to achieve electrical connection within the semiconductor device and also between the devices.

In addition, the semiconductor structure further includes a silicide block 250, and the silicide block 250 is located on the sidewall spacer 210 of the pixel region I, the top of the gate structures 150, the first doped region 161, and the silicide block 250. The semiconductor structure further includes a metal silicide layer 155 on top of the gate structure s150 in the logic region II and on the second source/drain doped region 162.

The silicide block 250 is used to prevent formation of the metal silicide layer 155 in the pixel region I. The silicide block 250 may be made of one or both of the silicon oxide and silicon nitride. In one embodiment, the silicide block 250 is made of silicon-rich silicon oxide, and the silicon-rich silicon oxide refers to a silicon oxide material with a high concentration of silicon.

In one embodiment, the metal silicide layer 155 at the top of the gate structure 150 is converted from a partial thickness of the gate structure 150, and the metal silicide layer 155 on the second source/drain doped region 162 is converted from a partial thickness of the substrate 100 corresponding to the second source/drain doped region 162. The metal silicide layer 155 is used to reduce the contact resistance. In one embodiment, the metal silicide layer 155 may be made of TiSi or NiSi.

In one embodiment, the semiconductor structure further includes an etching stop layer 260 between the interlayer dielectric layer 102 and the silicide block 250, between the interlayer dielectric layer 102 and the isolation structure 101, between the interlayer dielectric layer 102 and the metal silicide layer 155, and between the interlayer dielectric layer 102 and the sidewall spacer 210.

The etching stop layer 260 is used as an etching stop position of the etching process during the formation of the source/drain contact plugs 510 and the gate contact plugs 520, such that the insufficient etching or over-etching problem caused by different etching rates in different regions is avoided. In one embodiment, the etching stop layer 260 is made of silicon nitride.

Typically, the process of forming the sidewall spacer includes an etching process. In the present disclosure, the sidewall spacer 210 is located on the photosensitive region 100D of the substrate 100, and thus the etching process of forming the sidewall spacer 210 is not performed in the photosensitive region 100D. As such, the problems of plasma damage to the photosensitive region 100D and of charge remaining in the substrate 100 in the photosensitive region 100D can be avoided, thereby avoiding occurrence of damaged pixels. In addition, a metal connection layer 450 is formed on the first doped region 161, and the over-etching of the substrate 100 in the first doped region 161 can be avoided through the metal connection layer 450 during the formation of the source/drain contact plugs 510, thereby avoiding the dark current problems caused by over-etching, such as leakage current. Therefore, the performance of the pixel structure of the CIS in the present disclosure is improved compared with the semiconductor structure where there is no sidewall spacer on the photosensitive region of the substrate and where there is no metal connection layer on the first doped region.

Compared with conventional technologies, the semiconductor structure and its fabrication method in the present disclosure provide the following advantages.

For example, the sidewall film on the photosensitive region of the substrate of the is retained in the process of forming the sidewall spacer. That is, the sidewall film on the substrate in the photosensitive region is not etched, such that the plasma damage to the photosensitive region and the charge remaining in the photosensitive region of the substrate can be avoided, and thus avoiding the damaged pixels. On the other side, before forming an interlayer dielectric layer on the substrate, a metal connection layer is formed on the first doped region. The metal connection layer is used as an etching stop position of the etching process when subsequently forming the source/drain contact plug, thereby avoiding over-etching the substrate corresponding to the first doped region and the dark current problem caused by over-etching, such as the leakage current problem. Combining the above two advantages, the fabrication method in the present disclosure can improve the performance of the pixel structure of the CIS.

In one embodiment, the process of forming the metal connection layer includes forming a metal film covering the sidewall spacer, the gate structure, and the substrate; forming a second pattern layer on the metal film above the first doped region; using the second pattern layer as a mask to etch the metal film, forming a metal connection layer; removing the second pattern layer. The process of etching the metal film is a wet etching process. The present disclosure can avoid the problem of charge remaining in the pixel region by using a wet etching process, so that the dark current of the formed pixel structure can be reduced, as compared with the conventional method of etching the metal film by a dry etching process.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
    providing a substrate, containing first doping ions and including a pixel region for forming a pixel structure, the pixel region including a photosensitive region and a floating diffusion region adjacent to the photosensitive region;
    forming a deeply doped region, in the photosensitive region of the substrate and containing second doping ions with a type different from the first doping ions;
    forming a floating diffusion area, in the floating diffusion region of the substrate and containing third doping ions with a type different from the first doping ions;
    forming a gate structure on the substrate at a junction of the photosensitive region and the floating diffusion region;
    forming a sidewall film covering the gate structure and the substrate;
    removing the sidewall film on top of the gate structure in the floating diffusion region and on the floating diffusion region of the substrate, thereby forming a sidewall spacer including a remaining sidewall film, on the photosensitive region of the substrate, on sidewalls of the gate structure, and on top of the gate structure in the photosensitive region;
    using the sidewall spacer as a mask to form a first doped region in the floating diffusion area on one side of the gate structure, the first doped region containing fourth doping ions having a type different from the first doping ions;
    forming a metal connection layer on the first doped region;
    after forming the metal connection layer, forming an interlayer dielectric layer on the substrate exposed by the gate structure, the interlayer dielectric layer covering the gate structure; and
    forming a source/drain contact plug, in the interlayer dielectric layer and electrically connected to the metal connection layer.

2. The method according to claim 1, wherein forming the sidewall spacer comprises:
    forming a first pattern layer on the sidewall film of the photosensitive region;
    using the first pattern layer as a mask to etch the sidewall film on the top of the gate structure in the floating diffusion region and on the floating diffusion region of the substrate; and
    removing the first pattern layer.

3. The method according to claim 1, wherein forming the sidewall spacer includes:
    removing the sidewall film on the top of the gate structure in the floating diffusion region and on the floating diffusion region of the substrate by a plasma dry etching process.

4. The method according to claim 1, wherein:
the sidewall spacer includes a first silicon oxide layer, a silicon nitride layer on the first silicon oxide layer, and a second silicon oxide layer on the silicon nitride layer.

5. The method according to claim 1, wherein:
the metal connection layer is made of one or more of Ti, TiN, W, Ta, TaN and Al.

6. The method according to claim 1, wherein:
a thickness of the metal connection layer is in a range of about 500 Å to about 1000 Å.

7. The method according to claim 1, wherein:
forming the metal connection layer includes a physical vapor deposition process.

8. The method according to claim 1, wherein forming the metal connection layer comprises:
forming a metal film conformally covering the sidewalls of the gate structure, the gate structure, and the substrate;
forming a second pattern layer on the metal film above the first doped region;
using the second pattern layer as a mask to etch the metal film, thereby forming a metal connection layer; and
removing the second pattern layer.

9. The method according to claim 8, wherein:
the metal film is etched by a wet etching process.

10. The method according to claim 1, wherein:
the metal connection layer covers a portion of the surface of the first doped region; or
the metal connection layer covers an entire surface of the first doped region.

11. The method according to claim 1, wherein:
the pixel structure is N-type, the first doping ions are P-type, the second doping ions are N-type, the third doping ions are N-type, and the fourth doping ions are N-type; or
the pixel structure is P-type, the first doping ions are N-type, the second doping ions are P-type, the third doping ions are P-type, and the fourth doping ions are P type.

12. The method according to claim 1, further comprising:
forming a logic device on a logic region of the substrate;
forming a well region within the logic region of the substrate, before forming the gate structure on the substrate at the junction of the photosensitive region and the floating diffusion region;
forming a gate structure on the logic region of the substrate, when forming the gate structure at the junction of the photosensitive region and the floating diffusion region;
forming the sidewall spacer further on the sidewalls of the gate structure in the logic region, when forming the sidewall spacer in the photosensitive region;
forming a second source/drain doped region in the substrate on both sides of the gate structure of the logic region after forming the sidewall spacer and before forming the metal connection layer on the first doped region; and
forming the source/drain contact plug further in the interlayer dielectric layer of the logic region to electrically connect to the second source/drain doped region in the logic region.

13. The method according to claim 12, after forming the metal connection layer and before forming the interlayer dielectric layer on the substrate, further including:
forming a silicide block covering the sidewalls of the gate structure, the gate structure, the first doped region, the second source/drain doped region, and the metal connection layer;
forming a third pattern layer on the silicide block of the pixel region;
removing the silicide block from the logic region using the third pattern layer as a mask;
removing the third pattern layer; and
forming a metal silicide layer on top of the gate structure in the logic region and on the second source/drain region after removing the third pattern layer.

* * * * *